United States Patent
Kanarik et al.

(10) Patent No.: US 7,951,616 B2
(45) Date of Patent: May 31, 2011

(54) PROCESS FOR WAFER TEMPERATURE VERIFICATION IN ETCH TOOLS

(75) Inventors: Keren J. Kanarik, Folsom, CA (US); C. Robert Koemtzopoulos, Castro Valley, CA (US); James Rogers, Los Gatos, CA (US); Bi Ming Yen, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 12/571,947

(22) Filed: Oct. 1, 2009

(65) Prior Publication Data

US 2010/0022033 A1    Jan. 28, 2010

Related U.S. Application Data

(62) Division of application No. 11/392,356, filed on Mar. 28, 2006, now abandoned.

(51) Int. Cl.
*H01L 21/66* (2006.01)
*G01R 31/26* (2006.01)

(52) U.S. Cl. .............. 438/14; 257/E21.521; 257/E21.53

(58) Field of Classification Search ............... 438/14, 438/778; 257/E21.521, E21.525, E21.53
See application file for complete search history.

(56) References Cited

U.S. PATENT DOCUMENTS

| | | | |
|---|---|---|---|
| 5,399,387 A | 3/1995 | Law et al. | |
| 5,746,513 A | 5/1998 | Renken | |
| 5,769,540 A | 6/1998 | Schietinger et al. | |
| 5,900,290 A | 5/1999 | Yang et al. | |
| 6,150,283 A | 11/2000 | Ishiguro | |
| 6,164,816 A | 12/2000 | Aderhold et al. | |
| 6,178,390 B1 | 1/2001 | June | |
| 6,200,023 B1 | 3/2001 | Tay et al. | |
| 6,211,094 B1 | 4/2001 | Jun et al. | |
| 6,319,732 B1 | 11/2001 | Dils et al. | |
| 6,410,351 B1 | 6/2002 | Bode et al. | |
| 6,417,014 B1 * | 7/2002 | Lam et al. .................. | 438/14 |
| 6,441,351 B2 | 8/2002 | Hayasaki et al. | |
| 6,603,101 B2 | 8/2003 | Hayasaki et al. | |
| 6,622,104 B2 | 9/2003 | Wang et al. | |

(Continued)

FOREIGN PATENT DOCUMENTS

WO    WO 98/32165    7/1998

OTHER PUBLICATIONS

Office Action dated Mar. 11, 2008 from U.S. Appl. No. 11/392,356.

(Continued)

*Primary Examiner* — Matthew C Landau
*Assistant Examiner* — Joseph C Nicely
(74) *Attorney, Agent, or Firm* — Beyer Law Group LLP

(57) ABSTRACT

A blank wafer is placed in an etch chamber. A layer is deposited over the blank wafer, comprising providing a deposition gas, forming the deposition gas into a deposition plasma, and stopping the deposition gas. The blank wafer with the deposited layer is removed from the etch chamber. The thickness of the deposited layer is measured. Wafer temperature accuracy is calculated from the measured thickness of the deposited layer. The etch chamber is compensated according to the calculated wafer temperature accuracy. A wafer with an etch layer over the wafer and a patterned mask over the etch layer is placed into the etch chamber. The etch layer is etched in the etch chamber.

16 Claims, 6 Drawing Sheets

U.S. PATENT DOCUMENTS

| | | |
|---|---|---|
| 6,689,519 B2 | 2/2004 | Brown et al. |
| 6,733,594 B2 | 5/2004 | Nguyen |
| 6,849,470 B1 | 2/2005 | Eriguchi et al. |
| 6,850,322 B2 | 2/2005 | Campbell et al. |
| 6,864,189 B2 | 3/2005 | Hayes et al. |
| 6,876,442 B2 | 4/2005 | Vatus et al. |
| 6,884,640 B2 | 4/2005 | Peterson et al. |
| 6,960,416 B2 | 11/2005 | Mui et al. |
| 7,082,345 B2 | 7/2006 | Shanmugasundram et al. |
| 7,349,753 B2 | 3/2008 | Paik |
| 2002/0001788 A1 | 1/2002 | Sakamoto et al. |
| 2002/0022377 A1 | 2/2002 | Inada et al. |
| 2002/0045146 A1 | 4/2002 | Wang et al. |
| 2002/0069025 A1 | 6/2002 | Wang et al. |
| 2002/0085212 A1 | 7/2002 | Campbell et al. |
| 2003/0045960 A1 | 3/2003 | Yamamoto et al. |
| 2003/0121905 A1 | 7/2003 | Manno et al. |
| 2004/0173599 A1 | 9/2004 | Velichko et al. |
| 2004/0185619 A1 | 9/2004 | Chung |
| 2004/0222210 A1 | 11/2004 | Lin et al. |
| 2005/0201894 A1 | 9/2005 | Suzuki et al. |
| 2006/0027566 A1 | 2/2006 | Velichko et al. |
| 2006/0068599 A1* | 3/2006 | Baek et al. ............... 438/758 |
| 2006/0144335 A1 | 7/2006 | Lee et al. |
| 2006/0169669 A1 | 8/2006 | Zojaji et al. |
| 2006/0228818 A1 | 10/2006 | Chacin et al. |
| 2006/0284720 A1 | 12/2006 | Bras |
| 2007/0037301 A1* | 2/2007 | Jekauc ...................... 438/14 |
| 2007/0161290 A1 | 7/2007 | Fitzsimmons et al. |
| 2007/0260422 A1 | 11/2007 | Marcus et al. |
| 2008/0025369 A1 | 1/2008 | Patel et al. |
| 2008/0124818 A1 | 5/2008 | Li et al. |
| 2008/0153180 A1 | 6/2008 | Lansford et al. |
| 2008/0223716 A1 | 9/2008 | Ockenfuss et al. |

OTHER PUBLICATIONS

Final Office Action dated Aug. 19, 2008 from U.S. Appl. No. 11/392,356.

Office Action dated Nov. 11, 2008 from U.S. Appl. No. 11/392,356.

Final Office Action dated Apr. 29, 2009 from U.S. Appl. No. 11/392,356.

Office Action dated Aug. 6, 2009 from U.S. Appl. No. 11/392,356.

* cited by examiner though blocked by the reticle. In these processes, a
PROCESS FOR WAFER TEMPERATURE VERIFICATION IN ETCH TOOLS

CROSS-REFERENCES TO RELATED APPLICATIONS

This application is a Divisional of and claims priority under 35 U.S.C. §120 to U.S. patent application Ser. No. 11/392,356 filed Mar. 28, 2006 and entitled "PROCESS FOR WAFER TEMPERATURE VERIFICATION IN ETCH TOOLS", which is hereby incorporated by reference herein for all purposes.

BACKGROUND OF THE INVENTION

The invention relates to the formation of semiconductor devices. More specifically, the invention relates to the formation of semiconductor devices by etching features in a dielectric layer.

During semiconductor wafer processing, features of the semiconductor device are defined in the wafer using well-known patterning and etching processes. In these processes, a photoresist (PR) material is deposited on the wafer and then is exposed to light filtered by a reticle. The reticle may be a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

In semiconductor-based device (e.g., integrated circuits or flat panel displays) manufacturing, dual damascene structures may be used in conjunction with copper conductor material to reduce the RC delays associated with signal propagation in aluminum-based materials used in previous generation technologies. In dual damascene, instead of etching the conductor material, vias and trenches may be etched into the dielectric material and filled with copper.

SUMMARY OF THE INVENTION

To achieve the foregoing and in accordance with the purpose of the present invention, a method is provided. A wafer is placed in an etch chamber. A layer is deposited over the wafer. The thickness of the deposited layer is measured. Wafer surface temperature accuracy is calculated from the measured thickness of the deposited layer.

In another manifestation of the invention, another method is provided. A blank wafer is placed in an etch chamber. A layer is deposited over the blank wafer, comprising providing a deposition gas, forming the deposition gas into a deposition plasma, and stopping the deposition gas. The blank wafer with the deposited layer is removed from the etch chamber. The thickness of the deposited layer is measured. Wafer surface temperature accuracy is calculated from the measured thickness of the deposited layer. The etch chamber is compensated according to the calculated wafer temperature accuracy. A wafer with an etch layer over the wafer and a patterned mask over the etch layer is placed into the etch chamber. The etch layer is etched in the etch chamber.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

When an etch recipe is provided, it has been found that it is desirable to maintain consistent wafer temperatures between process chambers, since a wafer temperature increase of 1° C. may cause an etch feature CD increase of 1 nm. In this example, the feature CD increases linearly as the temperature increases. The measurement of wafer temperature may be performed to provide wafer temperature calibration between chambers or may be performed after maintenance to make sure that the chamber was correctly reassembled or may be performed periodically to make sure a chamber system has not degraded. Thermocouple wafers sold by SensArray® Corporation and OnWafer™ Technologies are wafers with built-in thermocouples for measuring wafer temperature. Such thermocouple wafers are expensive, may cause contamination, and may have other limitations.

Figure 1:
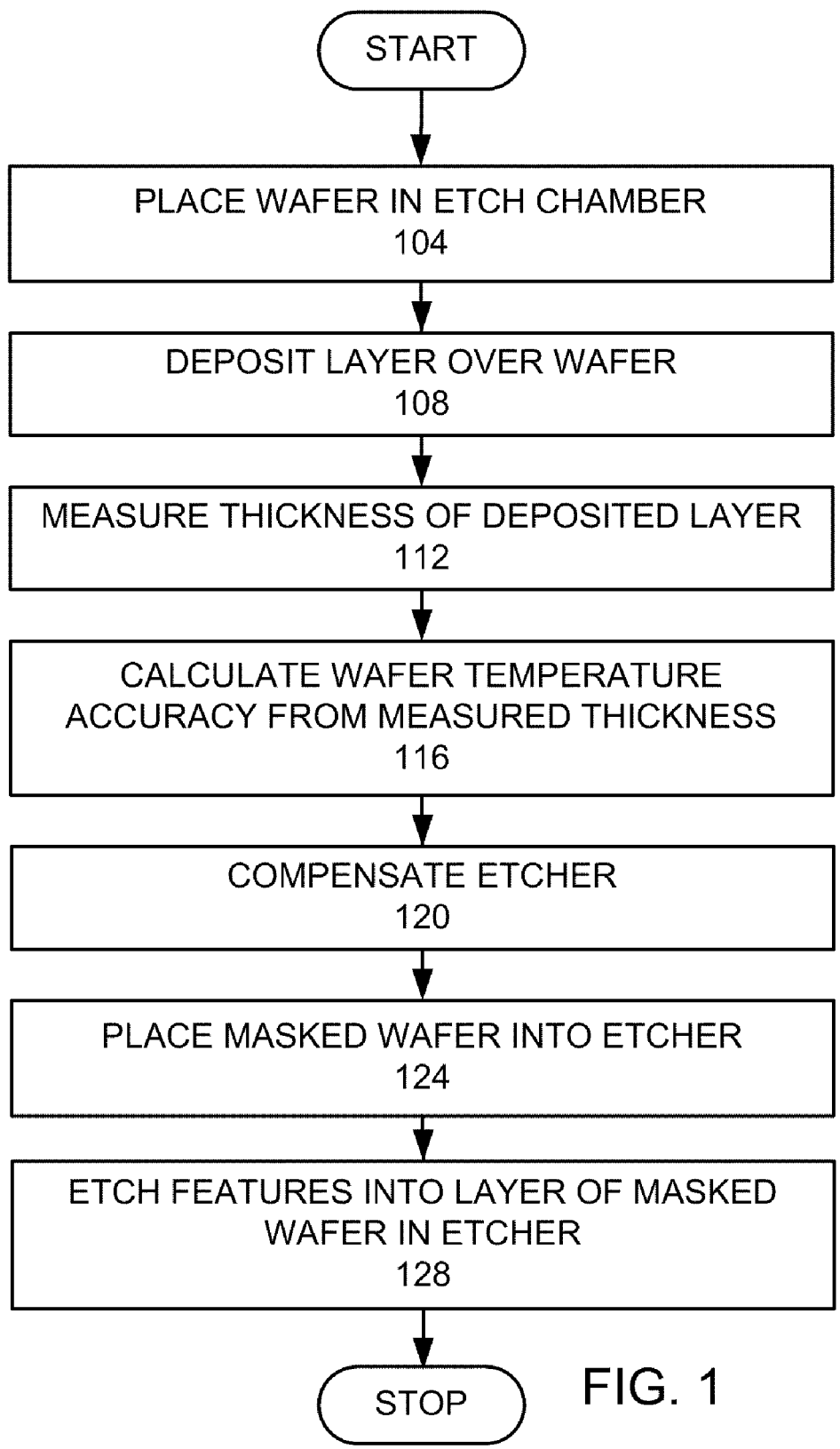
FIG. 1 is a high level flow chart of the formation of features in an etch layer used in an embodiment of the invention.
Figure 2A:
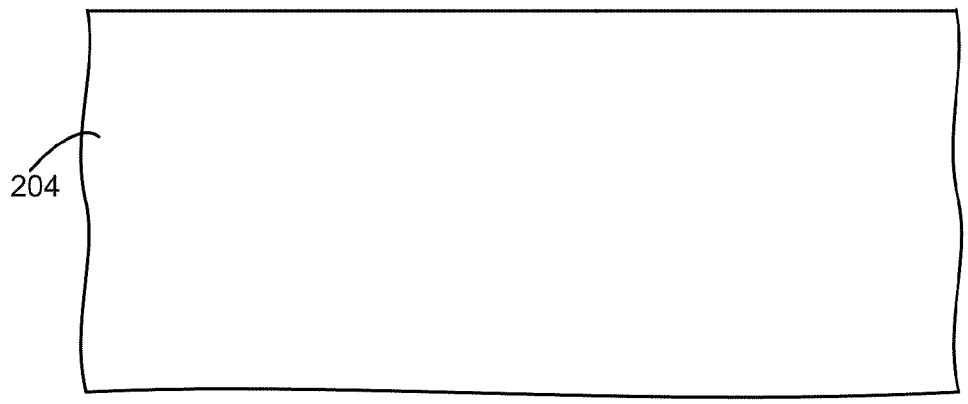
FIGS. 2A-B are schematic cross-sectional views of a wafer used in a process, as shown in FIG. 1.

To facilitate understanding, FIG. 1 is a high level flow chart of a process used in an embodiment of the invention. A wafer is placed in an etch chamber (step 104). FIG. 2A is a cross-sectional view of a wafer 204 that is placed in an etch chamber. Preferably, the wafer is a blank silicon wafer without anything formed over the wafer, i.e. without a blanket coating or any other layer or feature over it. In an alternative embodiment, the wafer is a blank silicon wafer with a blanket coating. A blanket coating is a uniform layer on a top wafer surface. The blanket coating may be an oxide blanket layer formed over the surface of the wafer. Other embodiments would provide a blank silicon wafer with a blanket coating of silicon nitride or photoresist. The blanket coating would preferably be a uniform layer over the wafer. The blank silicon wafer without a blanket coating is preferred, because such wafers are less expensive and the least complex which may provide the most consistent results. A blank silicon wafer with a blanket coating oxide, nitride, or photoresist may be more expensive and/or more complex, but may be more desirable, if such wafers are used for other tests and the user would prefer to use the same types of wafers for all tests. A photoresist blanket coating may be photoresist specific and may introduce other complexities, which may make such wafers less desirable.

Figure 4:
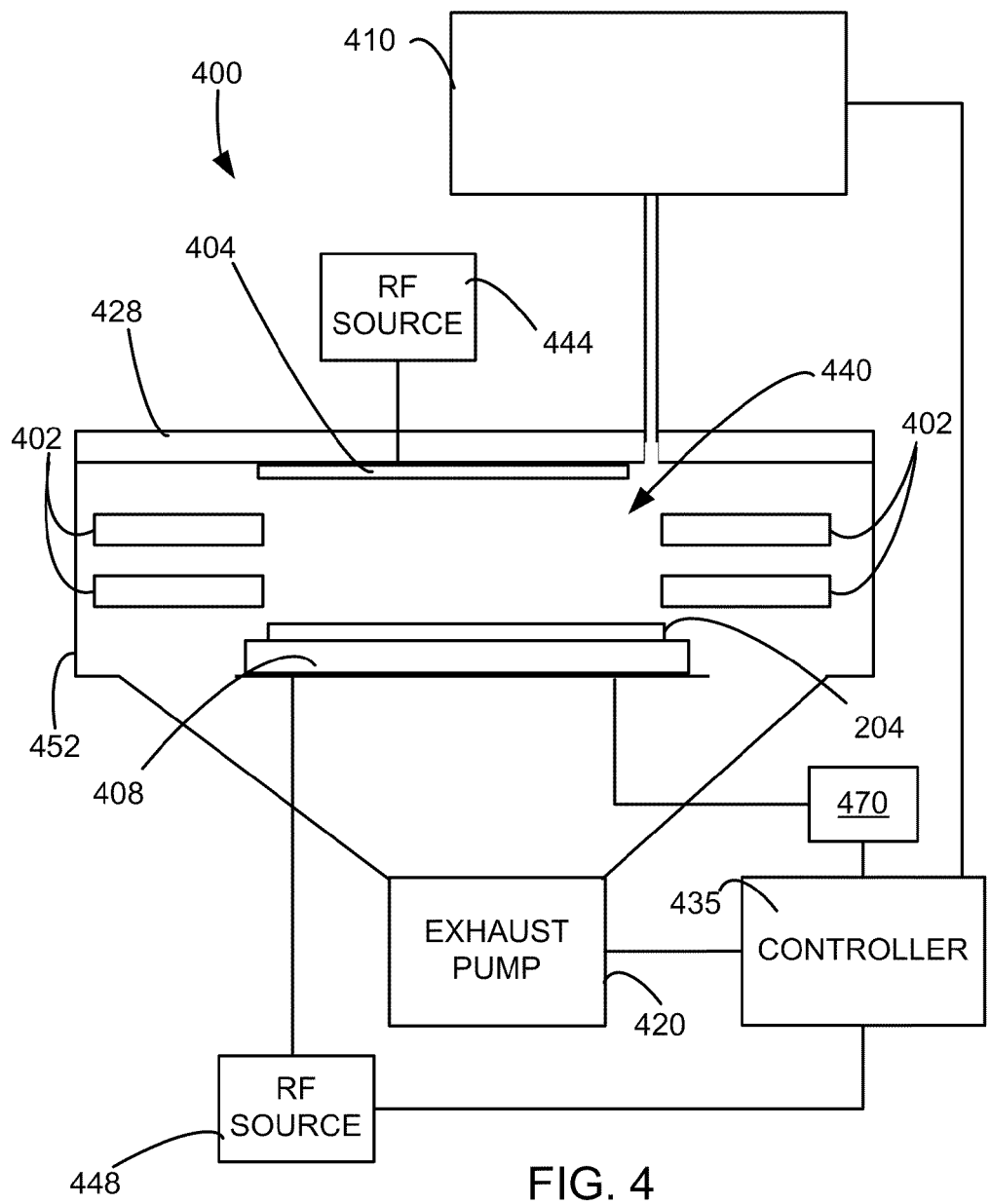
FIG. 4 is a schematic view of a plasma processing chamber that may be used for etching and stripping.

FIG. 4 is a schematic view of an etch chamber 400 that may be used in an embodiment of the invention. The plasma processing chamber 400 comprises confinement rings 402, an upper electrode 404, a lower electrode 408, a gas source 410, and an exhaust pump 420. The gas source 410 may comprise an etch gas source and a deposition gas source. Within plasma processing chamber 400, the wafer 204 is positioned upon the lower electrode 408. The lower electrode 408 incorporates a suitable substrate chucking mechanism (e.g., electrostatic, mechanical clamping, or the like) for holding the wafer 204. The reactor top 428 incorporates the upper electrode 404 disposed immediately opposite the lower electrode 408. The upper electrode 404, lower electrode 408, and confinement rings 402 define the confined plasma volume 440. Gas is supplied to the confined plasma volume by the gas source 410 and is exhausted from the confined plasma volume through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 27 MHz power source, a 60 MHz power source, and a 2 MHz power source. Different combinations of connecting RF power to the electrode are possible. In a preferred embodiment of the invention, the 27 MHz, 60 MHz, and 2 MHz power sources make up the second RF power source 448 connected to the lower electrode, and the upper electrode is grounded. A temperature control device 470 is connected to the lower electrode 408 to control the temperature of the lower electrode. A controller 435 is controllably connected to the RF sources 444, 448, exhaust pump 420, the temperature control device 470, and the gas source 410. Such a device is capable of modulating the pressure of the chamber, gas flow, gas combinations, RF power, electrostatic chuck cooling, and time duration for each phase.

Figure 5A:
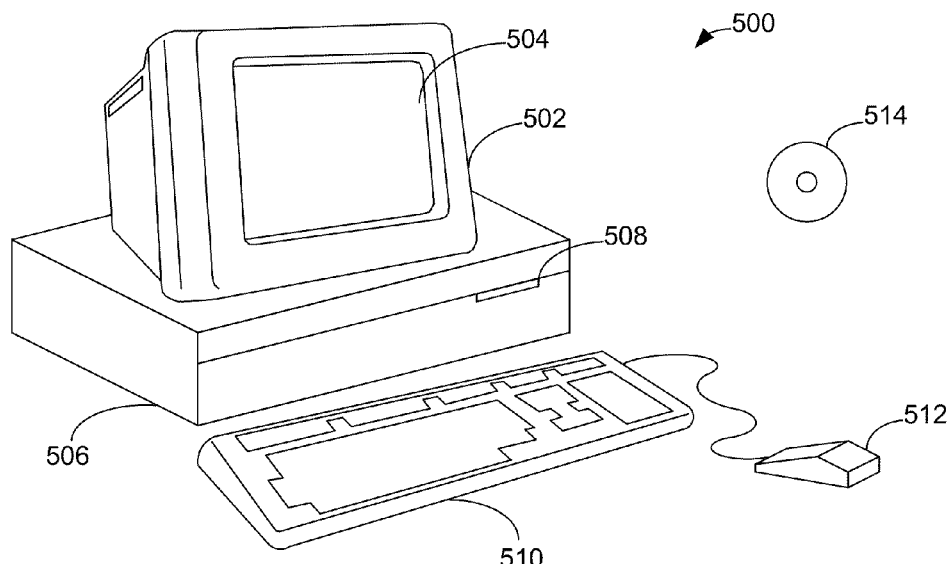
FIGS. 5A-B illustrate a computer system, which is suitable for implementing a controller used in embodiments of the present invention.
Figure 5B:
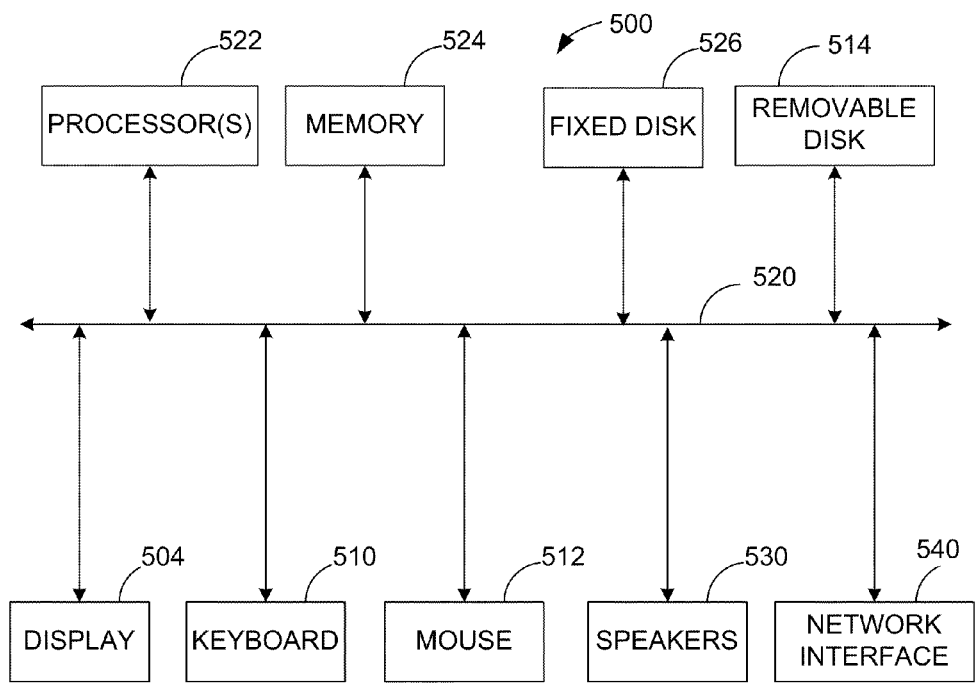

FIGS. 5A and 5B illustrate a computer system 500, which is suitable for implementing a controller 435 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 500 includes a monitor 502, a display 504, a housing 506, a disk drive 508, a keyboard 510, and a mouse 512. Disk 514 is a computer-readable medium used to transfer data to and from computer system 500.

FIG. 5B is an example of a block diagram for computer system 500. Attached to system bus 520 are a wide variety of subsystems. Processor(s) 522 (also referred to as central processing units, or CPUs) are coupled to storage devices, including memory 524. Memory 524 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 526 is also coupled bi-directionally to CPU 522; it provides additional data storage capacity and may also include any of the computer-readable media described below. Fixed disk 526 may be used to store programs, data, and the like and is typically a secondary storage medium (such as a hard disk) that is slower than primary storage. It will be appreciated that the information retained within fixed disk 526 may, in appropriate cases, be incorporated in standard fashion as virtual memory in memory 524. Removable disk 514 may take the form of the computer-readable media described below.

CPU 522 is also coupled to a variety of input/output devices, such as display 504, keyboard 510, mouse 512, and speakers 530. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 522 optionally may be coupled to another computer or telecommunications network using network interface 540. With such a network interface, it is contemplated that the CPU might receive information from the network, or might output information to the network in the course of performing the above-described method steps. Furthermore, method embodiments of the present invention may execute solely upon CPU 522 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
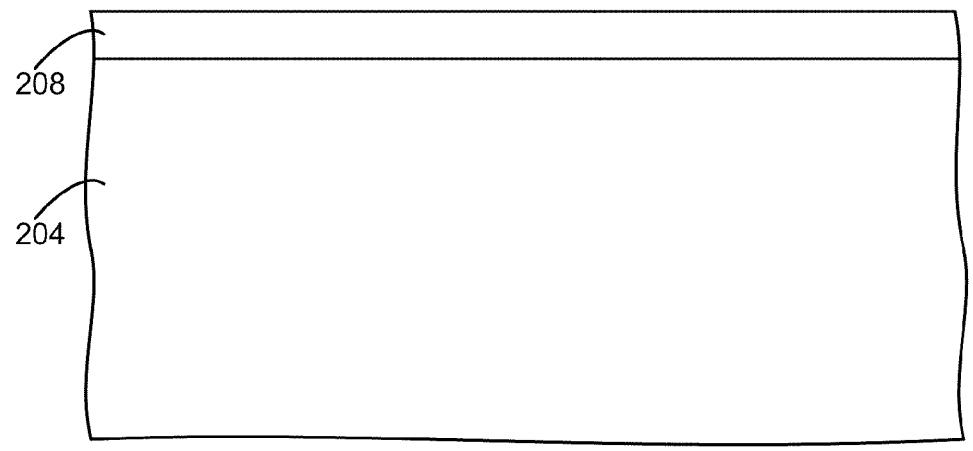

A layer is deposited over the wafer (step 108). FIG. 2B is a cross sectional view of the wafer 204 with a layer 208 deposited over the wafer 204. During the deposition, a deposition gas is provided to the etch chamber from a deposition gas source. A deposition plasma is generated from the deposition gas. The deposition plasma deposits a layer over the wafer surface.

An example recipe for depositing the layer over the wafer is as follows: A deposition etch phase gas of 18 sccm of $C_4F_8$ and 300 sccm of Ar is provided. A cooling system through the electrostatic chuck is set to keep the electrostatic chuck at a temperature of 20° C. The chamber pressure was set to 180 mTorr. 300 W were provided by the 27 MHz RF source and 300 W were provided by the 2 MHz power source. In this example, the deposition is provided for 120 seconds. Such a recipe forms a polymer layer over the wafer.

The thickness of the deposited layer is then measured (step 112). An ellipsometer made and sold by KLA-Tencor Corporation™ is a device that may be used to measure the thickness of the deposited layer. Other devices and methods may be used to measure the thickness of the deposited layer. Generally, such measurement devices require that the wafer is removed from the etch chamber and placed in the measurement tool before the thickness of the deposited layer is measured.

The thickness of the deposited layer is used to measure the temperature accuracy. In this example, the controller of the etcher is set to provide the deposition at a chuck temperature of 20° C. by either heating or cooling the electrostatic chuck.

The etcher is then compensated (step 120). If the thickness of the deposited layer is close to the set temperature of the electrostatic chuck, then the controller may be adjusted to compensate for this temperature difference. If there is a great difference between the set temperature of the electrostatic chuck and the temperature determined by the thickness of the deposited layer, then the etcher may be checked to make sure that the temperature controls are correctly connected and functioning and to see if changes and/or repairs are needed.

Figure 3A:
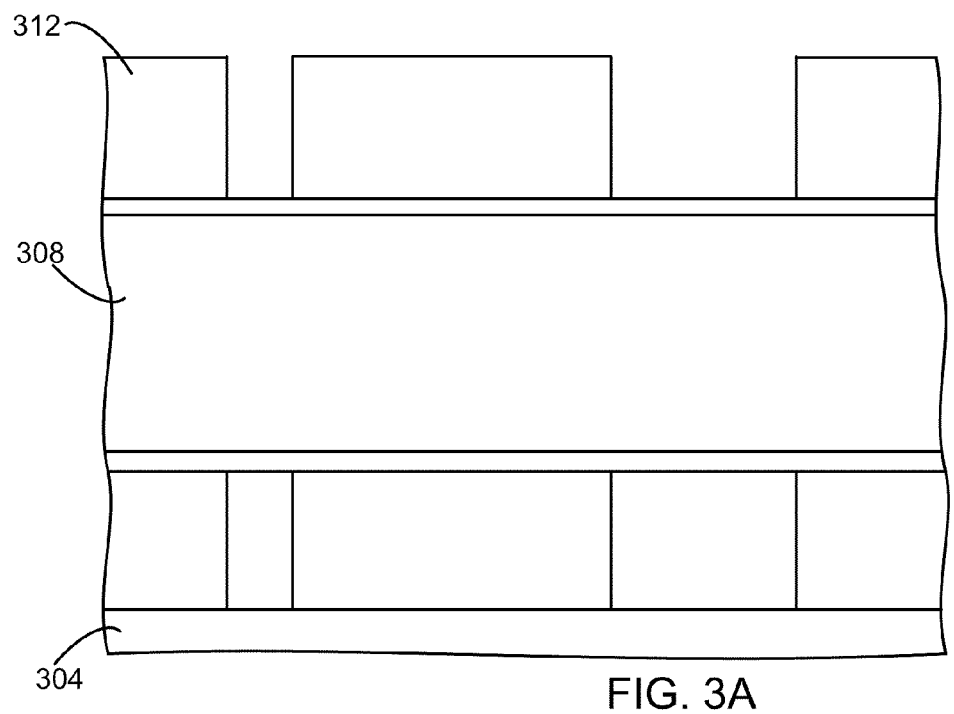
FIGS. 3A-B are schematic cross-sectional views of a masked wafer.
Figure 3B:
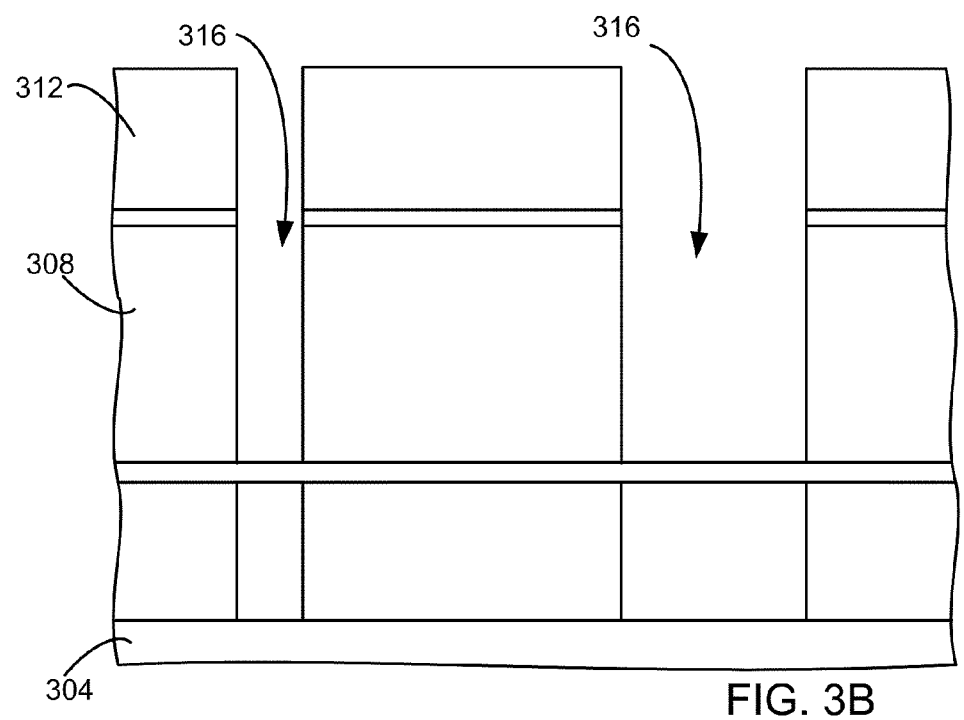

A masked wafer is then placed into the etcher (step 124). FIG. 3A is a cross sectional view of a wafer 304, over which an etch layer 308 is disposed, over which an etch mask 312 is disposed. Various numbers of intermittent layers may be disposed between the wafer 304, the etch layer 308, and the etch mask 312. Features 316 are etched into the etch layer 308 through the etch mask 312 in the etcher (step 128), as shown in FIG. 3B.

In one example if a system uses five etchers in parallel, the inventive deposition test may be used in each etcher. If four etchers provide a deposition with the same thickness and one etcher has a thinner deposition layer, it is concluded that the one etcher has a higher wafer temperature. The calculation of the wafer temperature accuracy from the measured thickness (step 116) could either calculate the wafer temperature for each chamber and then use the calculated temperatures to determine wafer temperature variances or may directly calculate the wafer temperature variance between chambers, without calculating wafer temperature. In this example, without calculating the wafer temperatures, it can be determined that the one etch chamber runs with a higher wafer temperature than the other four etchers. Various processes may be used to compensate the one etcher (step 120). One way of doing this would be by physically changing, such as repairing, a part of the one etcher. This may be done by changing the cooling system of the electrostatic chuck by changing the electrostatic chuck. A second way would be by changing the software recipe for the one etcher by programming in a lower temperature for only the one etcher. Since the one etcher runs at a higher wafer temperature, the request for a lower chuck temperature will compensate the higher wafer temperature actually provided. A third way is by providing a software offset, which automatically offsets the temperature according to the measured temperature.

It is desirable to select a deposition recipe, which is more sensitive to temperature and less sensitive to other parameters. In another embodiment a recipe may be used that is sensitive to other parameters, but the other parameters are held constant between tests. In another embodiment, if the recipe is sensitive to x parameters in a linear relationship, then x runs are made to generate x equations with x unknowns, which are simultaneously solved.

One of the unique aspects of the invention is the use of deposition to calibrate the wafer temperature for an etching device. By using a deposition process instead of an etching process, a blank wafer may be used, instead of a patterned wafer. The use of a patterned wafer would make the calibration process more complex by requiring a mask and since it would be more difficult to measure the uniformity of the etch.

The ability to measure temperature for an etcher using a deposition on a blank wafer was not obvious. It was not obvious whether such a method would be successful, reliable, consistent, and would provide stable results. Experiments were performed to see if this was possible and to see if this provided reliable, consistent, and stable results. The experiments showed that such a process would work and provide reliable, consistent, and stable results. Using blank wafers provides a simpler process that reduces complexities, which reduces sources of errors and reduces costs.

Figure 6:
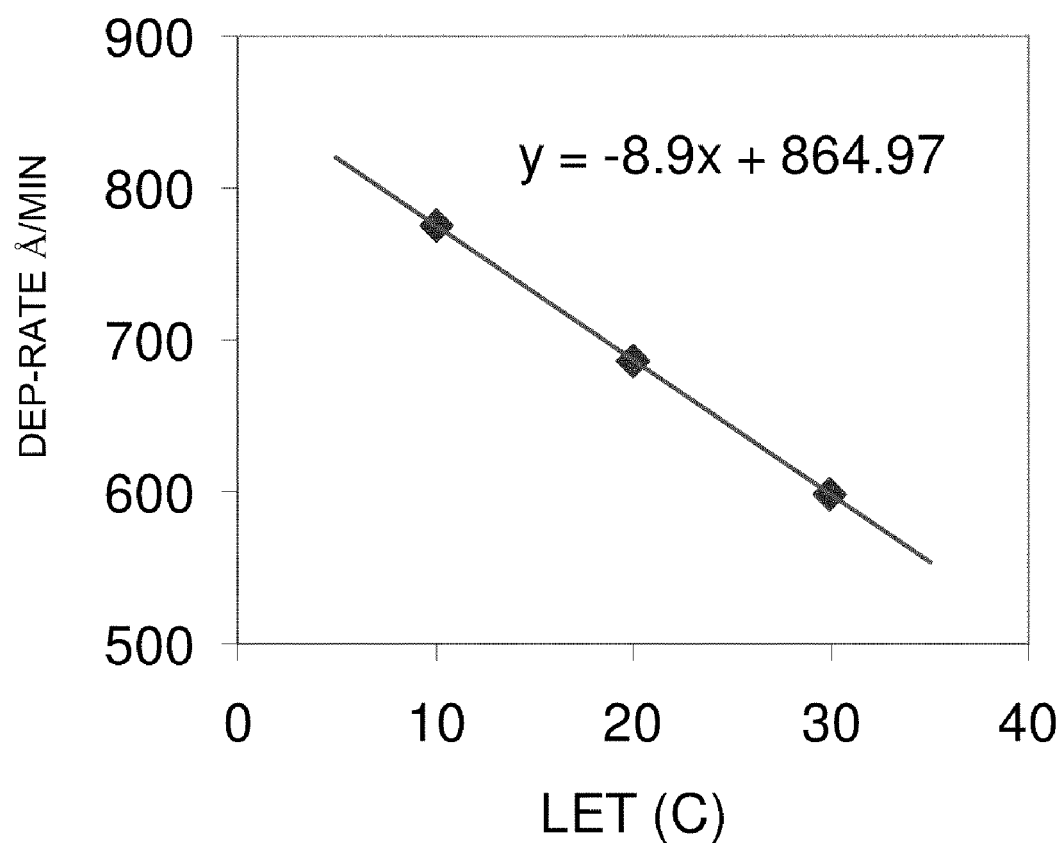
FIG. 6 is a plot of deposition rate in Å/min versus lower electrode temperature (LET).

In tests using the above recipe, it was found that the deposition rate changed systematically with wafer temperature by about −1.5%/° C., which is significantly larger than the 0-0.2%/° C. observed in most etch tests. Thus, the deposition thickness can be used as a measure of the temperature at which the polymer was deposited. FIG. 6 is a plot of deposition rate in Å/min versus lower electrode temperature (LET). A line passing through the resulting data has a slope of −8.9, which shows the approximate linear correlation between deposition rate and lower electrode temperature and/or wafer temperature Over a larger range of data, the relationship is between $1/T$ and $\ln k$ (Arrhenius Rate Law), but for sufficiently small ranges the relationship is approximately linear with k Vs T. Test results have also shown a wafer-to-wafer repeatability of <0.5%, which provides potential detection of temperature variation to ±0.3° C. The preferred deposition gas is C4F8 due to its availability and use in other qualification tests, although other fluorocarbon gases may be used. The temperature sensitivity is based on the absorption bonding energy, which is related to the lifetime of physisorbed precursors on the substrate. Higher surface temperature decreases the time for evaporation and thus reduces the likelihood of polymer formation. Thus, the sticking coefficient reduces with temperature and the process has apparent negative activation energy (~5 kcal/mol).

During actual tests, polymer thickness was measured using standard ellipsometry equipment such as KLA. The deposition test did not need pre-measurement, which saved time and improved the measurement. As per KLA instructions, the KLA measurements were based on a transferable "material card." Measurements had goodness-of-fit (GOF) confidence factor of 0.98 (>0.92 is acceptable), and were verified by SEM cross-sections. For the tool used in these tests a line scan is preferred over a polar map to eliminate bias towards edge measurements. It is preferred to use 25 mm edge exclusion (300 mm wafer) to keep uniformity as 2% (3σ). In different tools the preferred mapping and edge exclusion might be different.

Table 1 shows the results of four measurements of the same wafer with a deposition layer, according to an embodiment of the invention. The measurements measured the thickness of the deposition layer. Since the deposited layer on the wafer was deposited for 3 minutes, the measured thickness of the deposition layer is divided by 3 to obtain the deposition rate. The first row shows a measurement of the deposition rate of 610.7 Å/min, measured on Tool #1, which is a KLA ellipsometer. The second row shows a measurement of the deposition rate of 612.3 Å/min, also measured on Tool #1, soon after the first measurement. A difference of 0.2% is found, which indicates little variance between measurements on the same tool. The third row shows a measurement of the deposition rate of 608.7 on a second tool, Tool #1, which is also a KLA ellipsometer. A difference between the first measurement of Tool #1 and Tool #2 is 0.3%. This shows that the inventive process is repeatable between different KLA tools. The fourth row shows a measurement of the deposition rate of 611.0 Å/min on Tool #1, which was made two weeks after the first measurement on Tool #1. A difference between the first measurement of Tool #1 and this measurement two weeks later is found to be 0.05%. This shows that the thickness of the deposited layer is stable and does not significantly change over time, which removes a variable of dependence on time between deposition and measurement. It was also found that the inventive process had no seasoning effect after 10 depositions with an experimentally found difference of 0.3%.

TABLE 1

| Test Condition | Deposition Rate (Å/min) | Difference |
| --- | --- | --- |
| Tool #1 | 610.7 | 0% |
| Repeat Tool #1 | 612.3 | 0.2% |
| Tool #2 | 608.7 | 0.3% |
| Repeat Tool #1 two weeks later | 611.0 | 0.05% |

Other deposition gases may be used besides C4F8. Preferably, such deposition gases provide fluorine and carbon components without a hydrogen component. It is believed that a hydrogen component in atomic or molecular form may make the process less stable. It has been found that C4F6 and C4F8 provide a desired carbon to fluorine ratio component ratio to provide a desired deposition. Such gases provide carbon to fluorine components in ratios from 2:3 to 1:2.

The etch chamber may be any etch chamber, such as a dielectric etch chamber for etching dielectric layers or a conductive etch chamber for etching conductive layers or a silicon layer. Preferably, the etch chamber is a dielectric etch chamber.

In another embodiment, the calculating of the wafer temperature accuracy may also be used to determine the accuracy of other parameters such as gas flow, pressure, upper electrode temperature, and power, while measuring wafer temperature accuracy. For example, two runs may be used to measure the accuracy of the upper electrode temperature and lower electrode temperature. Each run would result in an equation with two variables. The two equations are used to solve for the two variables.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method, comprising:
   placing a wafer in an etch chamber;
   depositing a layer over the wafer;
   measuring a thickness of the deposited layer;
   calculating a deposition rate for the layer based on the measured thickness; and
   calculating wafer temperature variance from the measured thickness of the deposited layer by comparing the deposition rate to a deposition rate for a layer from a different etch chamber, without calculating wafer temperature.

2. The method, as recited in claim 1, further comprising:
   removing the wafer after depositing the layer over the wafer;
   placing an etch wafer with an etch layer over the etch wafer and a patterned mask over the etch layer into the etch chamber; and
   etching the etch layer in the etch chamber.

3. The method, as recited in claim 2, further comprising compensating the etch chamber according to the calculated wafer temperature variance before etching the etch layer.

4. The method, as recited in claim 3, wherein the compensating the etch chamber comprises at least one of repairing the etch chamber, changing an etch recipe, and providing a software offset.

5. The method, as recited in claim 4, wherein the wafer is a blank wafer with a blanket coating.

6. The method, as recited in claim 5, wherein the blanket coating is one of a silicon oxide, silicon nitride, and photoresist coating.

7. The method, as recited in claim 4, wherein the wafer is a blank wafer without a blanket coating.

8. The method, as recited in claim 7, wherein the measuring the thickness of the deposited layer, comprises:
   removing the wafer from the etch chamber;
   placing the wafer into an ellipsometer; and
   using the ellipsometer to measure the thickness of the deposited layer.

9. The method, as recited in claim 8, wherein the depositing, comprises:
   providing a deposition gas;
   forming the deposition gas into a deposition plasma; and
   stopping the deposition gas.

10. The method, as recited in claim 9, wherein the deposition gas has a carbon component with a flow rate and a fluorine component with a flow rate.

11. The method, as recited in claim 10, wherein a ratio of the flow rate of the carbon component and the flow rate of the fluorine component has a ratio in the range of 2:3 and 1:2.

12. The method, as recited in claim 10, wherein the deposition gas comprises at least one of $C_4F_6$ and $C_4F_8$.

13. The method, as recited in claim 1, further comprising compensating the etch chamber according to the calculated wafer temperature variance.

14. The method, as recited in claim 1, wherein the measuring the thickness of the deposited layer, comprises:
   removing the wafer from the etch chamber;
   placing the wafer into an ellipsometer; and
   using the ellipsometer to measure the thickness of the deposited layer.

15. The method, as recited in claim 1, wherein the depositing, comprises:
   providing a deposition gas;
   forming the deposition gas into a deposition plasma; and
   stopping the deposition gas.

16. The method, as recited in claim 15, wherein the deposition gas has a carbon component with a flow rate and a fluorine component with a flow rate.

* * * * *